United States Patent
Bocaneala et al.

(10) Patent No.: US 11,789,170 B2
(45) Date of Patent: Oct. 17, 2023

(54) INDUCED SEISMICITY

(71) Applicant: Schlumberger Technology Corporation, Sugar Land, TX (US)

(72) Inventors: Bogdan Bocaneala, Blackburn (GB); Michael Welch, Leeds (GB); Murat Zhiyenkulov, Kyiv (UA); Vincenzo De Gennaro, Pau (FR); Kamshat Ussenova, Kyiv (UA); David Cameron, Bucharest (RO)

(73) Assignee: Schlumberger Technology Corporation, Sugar Land, TX (US)

(*) Notice: Subject to any disclaimer, the term of this patent is extended or adjusted under 35 U.S.C. 154(b) by 929 days.

(21) Appl. No.: 16/310,485

(22) PCT Filed: Jun. 15, 2016

(86) PCT No.: PCT/IB2016/000985
§ 371 (c)(1),
(2) Date: Dec. 17, 2018

(87) PCT Pub. No.: WO2017/216594
PCT Pub. Date: Dec. 21, 2017

(65) Prior Publication Data
US 2019/0331811 A1  Oct. 31, 2019

(51) Int. Cl.
*G01V 1/00* (2006.01)
*E21B 47/06* (2012.01)
(Continued)

(52) U.S. Cl.
CPC .............. *G01V 1/008* (2013.01); *E21B 41/00* (2013.01); *E21B 43/26* (2013.01); *E21B 47/06* (2013.01);
(Continued)

(58) Field of Classification Search
CPC .. G01V 1/008; G01V 1/288; G01V 2210/646; E21B 43/25; E21B 47/06; E21B 49/00; E21B 7/04
See application file for complete search history.

(56) References Cited

U.S. PATENT DOCUMENTS 5,128,866 A * 7/1992 Weakley ................. E21B 47/06
702/14
5,675,088 A * 10/1997 Serata ..................... E21B 47/08
166/207

(Continued)

FOREIGN PATENT DOCUMENTS

EP     2960680 A1   12/2015
WO  2010115211 A1   10/2010

(Continued)

OTHER PUBLICATIONS

Maxewell et al; Geomechanical modeling of induced seismicity resulting from hydraulic fracturing; Special Section: Injection-induced seismicity; The Leading Edge Jun. 2015; pp. 678-683 (Year: 2015).*

(Continued)

*Primary Examiner* — Akash Saxena
(74) *Attorney, Agent, or Firm* — Jeffrey D. Frantz (57) ABSTRACT

A stimulation includes an injection of a volume of fluid into a formation. A method includes obtaining a mechanical earth model of the formation, modeling a hydraulic fracture growth pattern in the formation from a stimulation of the formation, determining an increase in pressure in the formation resulting from the stimulation, and predicting whether a seismic event will occur in the formation based on the increase in pressure.

18 Claims, 4 Drawing Sheets

(51) Int. Cl.
*G01V 1/28* (2006.01)
*E21B 43/26* (2006.01)
*E21B 49/00* (2006.01)
*E21B 41/00* (2006.01)
*G06F 30/28* (2020.01)
*E21B 7/04* (2006.01)

(52) U.S. Cl.
CPC .............. *E21B 49/00* (2013.01); *G01V 1/282* (2013.01); *G06F 30/28* (2020.01); *E21B 7/04* (2013.01)

(56) References Cited

U.S. PATENT DOCUMENTS

| | | | | |
|---|---|---|---|---|
| 6,389,361 | B1* | 5/2002 | Geiser | G01V 1/008 702/15 |
| 8,121,792 | B2 | 2/2012 | Hsu | G01V 1/28 702/15 |
| 10,329,903 | B2* | 6/2019 | Ramakrishnan | E21B 49/00 |
| 10,724,346 | B2* | 7/2020 | Eftekhari Far | G01V 99/005 |
| 10,810,331 | B2* | 10/2020 | Umholtz | G06F 30/20 |
| 2007/0038377 | A1* | 2/2007 | Sayers | G01V 1/30 702/9 |
| 2010/0228530 | A1* | 9/2010 | Valero | G01V 1/288 703/2 |
| 2011/0067857 | A1* | 3/2011 | Underhill | G01V 1/40 702/9 |
| 2014/0077074 | A1* | 3/2014 | Harley | G01V 1/008 250/255 |
| 2014/0151033 | A1* | 6/2014 | Xu | E21B 43/267 166/308.1 |
| 2014/0372089 | A1* | 12/2014 | Weng | E21B 43/26 703/2 |
| 2015/0060058 | A1* | 3/2015 | Morris | E21B 43/26 166/250.02 |
| 2015/0204174 | A1* | 7/2015 | Kresse | E21B 43/26 166/250.01 |
| 2015/0241582 | A1* | 8/2015 | Kahn | G01V 1/288 702/14 |
| 2015/0331122 | A1* | 11/2015 | Prange | G01V 1/305 702/14 |
| 2016/0108705 | A1 | 4/2016 | Maxwell et al. | |
| 2017/0051598 | A1* | 2/2017 | Ouenes | G06F 30/20 |
| 2017/0132339 | A1* | 5/2017 | Umholtz | G06F 17/11 |
| 2017/0269244 | A1* | 9/2017 | Teran | G01V 1/288 |
| 2018/0231677 | A1* | 8/2018 | Shojaei | G01V 1/288 |
| 2020/0325751 | A1* | 10/2020 | Sharma | G01V 1/181 |
| 2020/0325759 | A1* | 10/2020 | Sharma | G01V 1/288 |

FOREIGN PATENT DOCUMENTS

| | | | | |
|---|---|---|---|---|
| WO | | 2014032003 A1 | 2/2014 | |
| WO | WO 2014/032003 A1 * | | 2/2014 | ............ E21B 43/26 |

OTHER PUBLICATIONS

Hajati, T., C. Langenbruch, and S. A. Shapiro (2015), A statistical model for seismic hazard assessment of hydraulic-fracturing-induced seismicity, Geophys. Res. Lett., 42, pp. 10,601-10,606, doi:10.1002/2015GL066652.; Dec. 23, 2015 (Year: 2015).*

William L. Ellsworth ,Injection-Induced Earthquakes.Science341,1225942(2013).DOI:10.1126/science.1225942 p. 8 (Year: 2013).*

Zhao et al., "Numberical Simulation of Seismicity Induced by Hydraulic Fracturing in Naturally Fractured Reservoirs", SPE 124690, SPE Annual Technical Conference and Exhibtion, Oct. 2009, 17 pages.

Santos et al., "Modeling hydraulic fracturing and induced seismicity in unconventional reservoirs using multphase fluid-flow simulations", SEG Technical Program Expanded Abstracts, Aug. 19, 2015, pp. 5053-5057.

International Search Report and Written Opinion issued in International Patent Application No. PCT/IB2016/000985 dated Apr. 18, 2017; 20 pages.

* cited by examiner

INDUCED SEISMICITY

BACKGROUND

Hydrocarbons (oil, natural gas, etc.) may be obtained from a subterranean geological formation, or reservoir, by drilling a well that penetrates the hydrocarbon-bearing formation. This provides a partial flowpath for the hydrocarbon to reach the surface. In order for the hydrocarbon to be produced, that is travel from the formation to the wellbore and ultimately to the surface, a sufficiently unimpeded flowpath should be formed from the formation to the wellbore.

Hydraulic fracturing may improve well productivity by extending reservoir contact between the borehole and the reservoir. This operation may be performed by perforating a wellbore penetrating the formation and hydraulically injecting a fracturing fluid into the wellbore and forcing the fracturing fluid against the formation strata by pressure. The formation strata or rock is forced to crack and fracture, thereby increasing flow paths between the reservoir and the borehole. Proppant may be placed in the fracture to prevent the fracture from closing and thus, provide improved flow of the recoverable hydrocarbons.

Once a fracture is initiated, enough bottomhole pressure may be maintained to propagate the fracture further away from the wellbore and generate the necessary fracture width for it to be filled with the propping material that will keep the fracture open once the pumping has stopped. The initial breakdown pressure may be higher than the minimum pressure needed to re-open the same fracture due to the tectonic stress in the rock that has to be initially overcome.

Hydraulic fracturing, including perforating and fluid injection into a formation, may induce or trigger seismic activity. Fluid withdrawal (e.g., pumping hydrocarbons from the formation) from hydraulic fracturing operations may also induce seismic activity.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments of the present disclosure relate to a method that includes obtaining a mechanical earth model of a formation, modeling a hydraulic fracture growth pattern in the formation from a stimulation of the formation, the stimulation including an injection of a volume of fluid into the formation, determining an increase in pressure in the formation resulting from the stimulation, and predicting whether a seismic event will occur in the formation based on the increase in pressure.

In another aspect, embodiments disclosed herein relate to a method that includes obtaining a mechanical earth model of a formation, modeling a hydraulic fracture growth pattern in the formation from a stimulation of the formation, the stimulation being performed in a plurality of stages along a borehole extending through the formation, determining an increase in pressure in the formation resulting from the stimulation, generating a stress profile for each of the plurality of stages, each stress profile including a map of stress over an area of the formation, performing at least one of the stages of the stimulation, measuring stress within the area of the formation around a completed stage of the stimulation to generate a measured stress profile of the completed stage, and calibrating the completed stage of the stimulation prior to performing a subsequent stage of the stimulation, where calibrating includes updating one or more input parameters of the model to match the modeled stress profile of the completed stage with the measured stress profile of the completed stage.

In yet another aspect, embodiments disclosed herein relate to system for generating a model of a formation that includes a computer processor and memory comprising instructions executing on the computer processor with functionality to perform: receiving parameters of the formation, modeling a mechanical earth model of the formation based on the parameters, simulating a stimulation of the formation, the stimulation including an injection of a volume of fluid into the formation, modeling a hydraulic fracture growth pattern in the formation from the stimulation of the formation, and presenting, on a graphical user interface, a stress profile of the formation including changes in stress through the formation resulting from a change in pressure through the reservoir, the stress profile generated from the mechanical earth model and the hydraulic fracture growth pattern model.

Other aspects of the invention will be apparent from the following description and the appended claims.

DETAILED DESCRIPTION

Embodiments of the present disclosure relate generally to methods for evaluating the potential of generating induced seismicity caused by hydraulic fracturing operations or large volume water injection operations. Evaluating potential of induced seismicity may facilitate planning permissions for shale gas operators in sensitive areas, such as high population density areas. Methods of the present disclosure may provide recommendations for well planning to mitigate the risk of generating induced seismicity, such as drilling direction, fracture initiation point locations, fracture fluid volume, fracturing fluid type, and maximum proppant concentration.

Methods according to embodiments of the present disclosure may be initially completed with relatively little data and high uncertainty. The level of uncertainty may be reduced as well construction operations progress and additional well data is collected, for example, through data acquisition from drilling, wireline logs, core analysis, and surface analysis. Uncertainty of generating induced seismicity during hydraulic fracturing operations may be further reduced by updating and calibrating the model using offset well data.

According to embodiments of the present disclosure, methods of evaluating and/or predicting induced seismic activity may include evaluating natural fractures, faults and other geological features in a target reservoir or formation. Properties of a target formation, including but not limited to material properties, natural fractures, faults and other geological features in the target formation, may be characterized using available core data, borehole imaging data, outcrop analogues, seismic data, and other wellsite data, for example. For example, outcrop analogues may be used to understand fracture density, distribution, orientation, geometry and connectivity in the subsurface of the formation.

Evaluation of natural fractures and faults may include data acquisition from subsurface measurement tools and/or surface measurement tools. For example, subsurface tools, such as logging tools, may be sent down a hole drilled through a formation to measure properties of the formation below the surface, such as density, porosity, and resistivity. In downhole logging, instruments (e.g., magnetic induction sensors or gamma-ray sensors) may be attached to a downhole tool that transmits sensed data up a wireline or via another communication channel to a data processing system. Surface measurement tools may measure different properties of the formation from the surface of the formation. For example, seismometers along a surface of a formation may measure seismic waves generated by seismic activity of the formation. In some embodiments, surface analysis may include analyzing surficial geology, such as by characterizing layers between rock volumes with different properties, analyzing changes in rock types at the surface, and/or analyzing changes in geological features at the surface, such as fault lines.

Many types of data acquisition may be used for gathering data related to formation properties, including but not limited to seismic data acquisition (e.g., activating a seismic source, such as airguns, vibrators or explosives, generating sufficient acoustic energy to penetrate the earth, and recording reflected or refracted parts of this energy by seismic receivers such as hydrophones and geophones), logging or drilling operations of the oil and gas industry, and of interpretations made from these measurements. The data may be gathered above, on, or below the earth's surface. As the duration or number of sub-surface operations increases, more data may be gathered.

Further, in some embodiments, seismic activity (including micro-seismic events and/or macro-seismic events) in a formation of interest may be measured for a time period to determine if the formation has an active fault. Monitoring of seismic activity in a formation of interest may be conducted prior to stimulation operations in the formation, for example, to determine preexisting conditions in the formation that may be relevant for modeling mechanical earth models and when modeling fracturing networks, as described more below. Seismic activity in the formation of interest may continue to be monitored after conducting stimulation operations, for example, for collecting data useful in calibration of one or more models of the formation.

Mechanical earth models of a formation may be generated based on data acquired from the formation and may include a map of both the geological features (e.g., micro- and macro-scale natural fractures and faults) and the mechanical properties in the formation of interest. For example, mechanical earth models, such as boundary element, finite element and discrete element models, may be used to predict fracture distribution and orientation around larger structures such as faults and folds. In faulted settings, a formation may be modeled multiple times, once in each block of the formation containing a fault, with a different deformed shape in each block.

Figure 1:
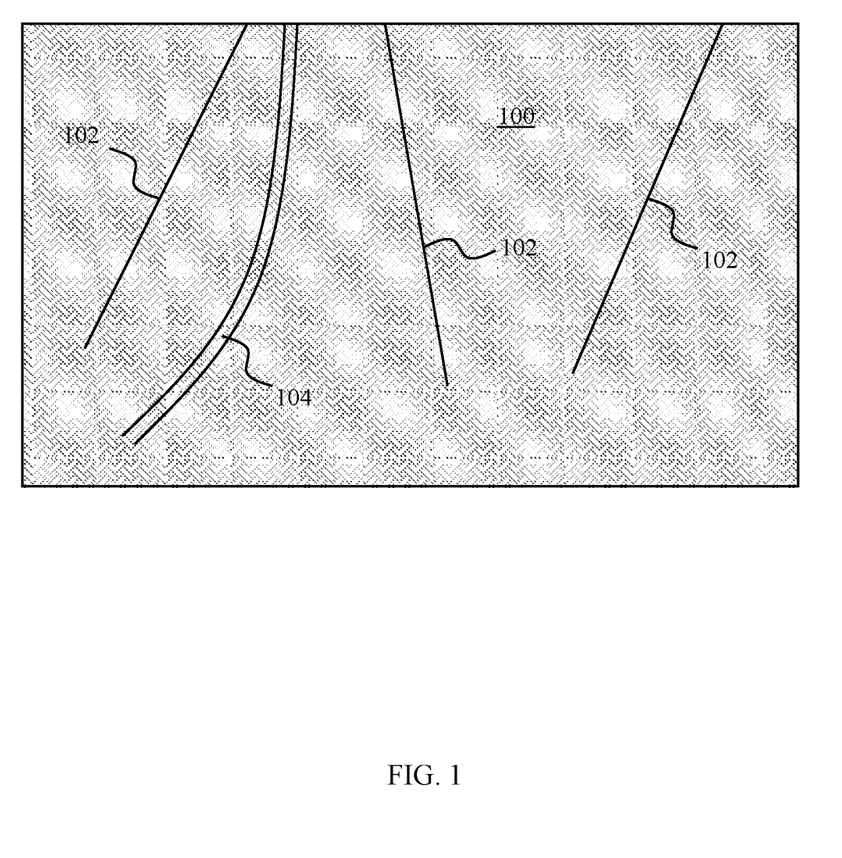
FIG. 1 depicts an example of a formation having geological features therein.

FIG. 1 shows an example of a formation 100 having fault lines 102 extending below the surface of the formation 100. A volume of interest of the formation 100 is shown in FIG. 1, which may vary depending on, for example, the seismic survey coverage or how engineers define their models (e.g., by the entire reservoir or part of a reservoir). For example, a volume of interest may include part of a reservoir or an entire reservoir, which may range, for example, from several cubic kilometers or more. The fault lines 102 through the volume of interest may be used to define fault blocks. The technique of designating fault lines through a volume of interest in a formation is referred to as fault splitting, where the faults separate the volume of interest into fault blocks. The fault blocks may or may not contain one or more wellbores. For example, as shown in FIG. 1, a wellbore 104 extends through a fault block in the formation 100 between two fault lines 102. A structural framework model of the volume of interest may be generated by partitioning the fault blocks into a set of blocks units (e.g., by partitioning the fault blocks with horizon lines) and organizing geological data (obtained through data acquisition from above or below the surface of the formation, such as described above) into several sub-regions of the formation 100. For example, surface and sub-surface data points lying inside a fault block may be isolated and extrapolated past the boundaries of the block unit under investigation, and material properties may be assigned to each of the subregions.

Modeling software may be used to generate mechanical earth models of a formation based on data acquired from the formation. For example, modeling software may be used to predict fracture density, vertical connectivity and aperture in a mechanically layered sequence based on well log data from a formation. According to some embodiments, a system for generating a model of a formation may include a computer processor and memory having instructions executing on the computer processor with functionality to receive parameters of the formation (e.g., from data acquisition) and to model a mechanical earth model of the formation based on the parameters. In some embodiments, a system may also include at least one sensor in communication (e.g., wired or wireless communication) with a computer processor running modeling software, where the sensor(s) may measure at least one parameter of the formation.

Modeling software useful for modeling a formation may include but is not limited to GeoFrame™, Petrel™, and RDR Fault Modeler™ software, marketed by Schlumberger, for example. Other modeling software may be used to model geomechanical models of a formation of interest, such as FluvSim™, Roxar™ by Emerson, SKUA™ by Paradigm, IHS Kingdom™ by IHS, and Jewel Suite™ by Baker Hughes.

Figure 2:
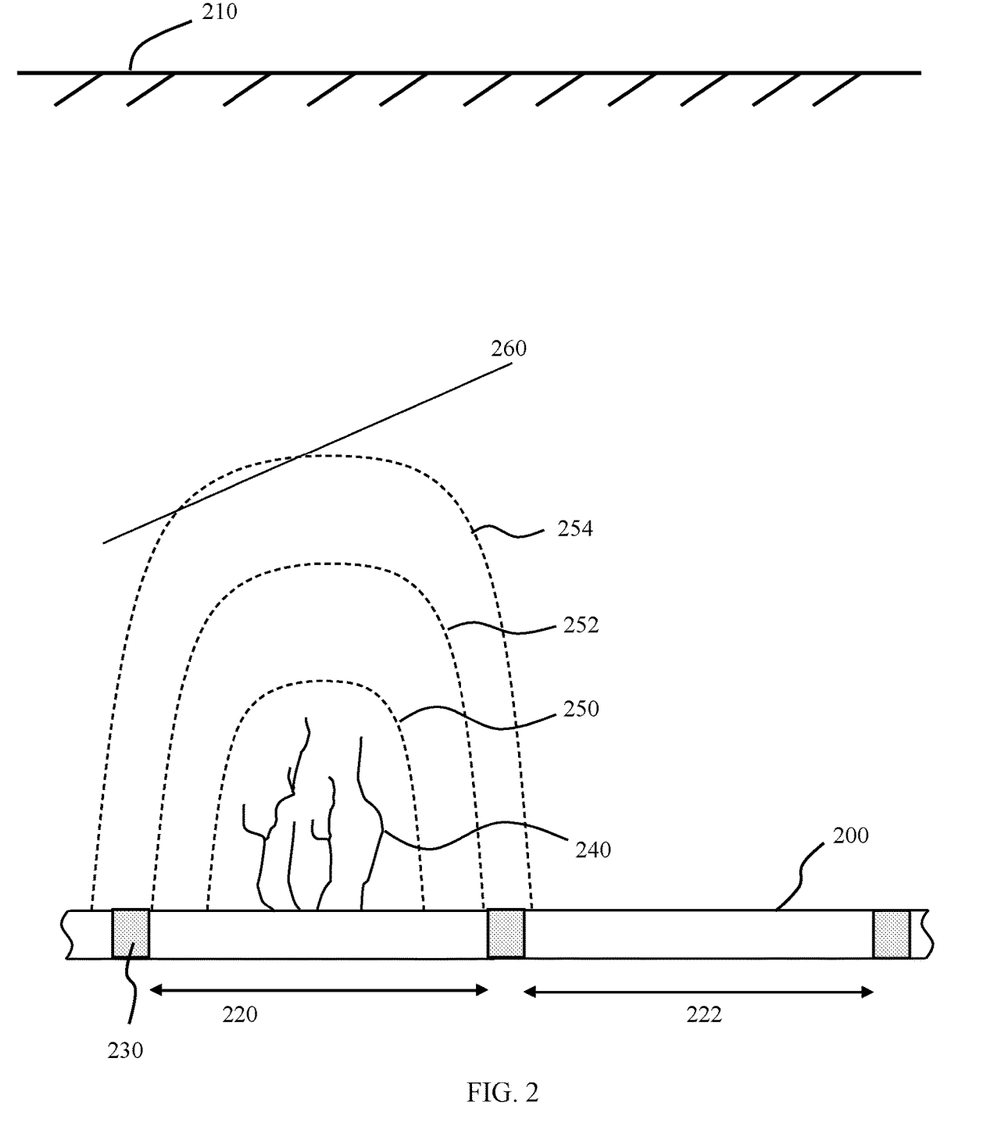
FIG. 2 shows a diagram of a multistage stimulation of a formation according to methods of the present disclosure.

In addition to obtaining a mechanical earth model of a formation of interest, embodiments of the present disclosure may include modeling a hydraulic fracture growth pattern in the formation (modeled by the mechanical earth model) resulting from a stimulation in the formation. The interaction of hydraulic fractures resulting from a stimulation, fractures from drilling operations, natural fractures and faults may be included in a hydraulic fracture growth pattern model. FIG. 2, discussed in detail below, shows a diagram of an example of simulating a multistage stimulation in a formation 210 of interest. In the simulation of the stimulation, both the mechanical earth model and the hydraulic fracture growth pattern in the formation 210 may be used to predict changes in pressure and stress throughout the formation 210, and thus may be used to predict seismic activity.

As used herein, stimulation may refer to selectively placing wellbore stimulation fluids (e.g., acids) downhole during a stimulation operation (or treatment) to facilitate the production of fluids from subsurface reservoirs. Stimulation operations may involve, for example, acid treatments, such as matrix acidizing, or hydraulic fracturing. Matrix acidizing may involve pumping an acid into an oil or gas-producing well to remove some of the formation damage along a wall of the wellbore caused by the drilling and completion fluids and drill bits during the drilling and completion process. Hydraulic fracturing may involve injecting a volume of fluid into the formation to create fractures that define larger pathways for fluid to pass from subsurface reservoirs and into the wellbore. Stimulation fluids may be placed in select zones along the wellbore based on an understanding of operational objectives, such as maximum production rate, maximum fluid recovery, uniform placement of fluids across zones, and/or other objectives, for performing the stimulation operation. The stimulation fluids may also be applied using various stimulation parameters, such as flow rates, concentrations, composition, etc. Other considerations may be taken into account, such as the skin surrounding the wellbore and/or other wellsite parameters.

Modeling software may be used to simulate a stimulation in a formation of interest. According to embodiments of the present disclosure, the modeling software for simulating a stimulation may take into account stress anisotropy through the formation as well as the interactions of the hydraulic fractures with the natural fractures in the formation. For example, an unconventional fracture model (UFM) (or complex model) may be used to simulate complex fracture network propagation in a formation with pre-existing natural fractures. Multiple fracture branches can propagate simultaneously and intersect/cross each other. Each open fracture may exert additional stresses on the surrounding rock and adjacent fractures, which may be referred to as "stress shadow" effect. The stress shadow can cause a restriction of fracture parameters (e.g., width), which may lead to, for example, a greater risk of proppant screenout. The stress shadow can also alter the fracture propagation path and affect fracture network patterns. The stress shadow may affect the modeling of the fracture interaction in a complex fracture model. Thus, to simulate the propagation of multiple or complex fractures, a fracture model may take into account an interaction among adjacent hydraulic fracture branches (the stress shadow effect). When a single planar hydraulic fracture is opened under a finite fluid net pressure, it may exert a stress field on the surrounding rock that is proportional to the net pressure.

Fracture interaction, including planar and complex fractures propagating from multiple perforation clusters along a borehole in stimulation operations, may control the fracture dimension and propagation pattern. In a formation with small stress anisotropy, fracture interaction may lead to dramatic divergence of the fractures as they may tend to repel each other. However, even when stress anisotropy is large and fracture turning due to fracture interaction is limited, stress shadowing may have a strong effect on fracture width, which may affect the injection rate distribution into multiple perforation clusters, and hence overall fracture network geometry and proppant placement.

The dynamics of simultaneously propagating multiple fractures may also depend on the relative positions of the initial fractures. If the fractures are parallel, e.g. in the case of multiple fractures that are orthogonal to a horizontal wellbore, the fractures may repel each other, resulting in the fractures curving outward. However, if the multiple fractures are arranged in an en echelon pattern, e.g. for fractures initiated from a horizontal wellbore that is not orthogonal to the fracture plane, the interaction between the adjacent fractures may be such that their tips attract each other and even connect.

When a hydraulic fracture intersects a secondary fracture oriented in a different direction, it may exert an additional closure stress on the secondary fracture that is proportional to the net pressure. This stress may be derived and be taken into account in the fissure opening pressure calculation in the analysis of pressure-dependent leakoff in fissured formation.

For more complex fractures, a combination of various fracture interactions as discussed above may be present. To properly account for these interactions and remain computationally efficient so it can be incorporated in the complex fracture network model, a proper modeling framework may be constructed. A method based on an enhanced 2D Displacement Discontinuity Method (2D DDM) may be used for computing the induced stresses on a given fracture and in the rock from the rest of the complex fracture network. Fracture turning may also be modeled based on the altered local stress direction ahead of the propagating fracture tip due to the stress shadow effect. According to embodiments of the present disclosure, simulations of a hydraulic fracture network may include an UFM model that incorporates fracture interaction modeling. For example, fracture interaction may be taken into account to model hydraulic fracture propagation in naturally fractured reservoirs. This includes, for example, the interaction between hydraulic fractures and natural fractures, as well as interaction between hydraulic fractures.

In some embodiments, a wiremesh model may be used to simulate nonplanar complex hydraulic fractures in reservoirs and model a hydraulic fracture growth pattern. A wiremesh model is a mathematical representation of the hydraulic fracture network, which may provide an estimation of fracture network dimensions.

A hydraulic fracture growth pattern may be modeled in a mechanical earth model to obtain a combined fracture growth and mechanical earth model. The combined fracture growth and mechanical earth model may be used for analysis of effects in the formation from a stimulation.

According to some embodiments of the present disclosure, methods of formation analysis may include obtaining a mechanical earth model of a formation, modeling a hydraulic fracture growth pattern in the formation from a stimulation of the formation, determining an increase in pressure in the formation resulting from the stimulation, and predicting whether a seismic event will occur in the formation based on the increase in pressure.

Using a generated mechanical earth model and hydraulic fracture growth pattern model of a formation, pressure changes in the formation as a result of a stimulation (e.g., fluid injection during a hydraulic fracturing operation) may be determined. For example, initial pressure measurements may be determined in a formation of interest prior to conducting and/or simulating a stimulation within the formation. Initial pressure measurements may be calculated from a mechanical earth model of the formation and/or may be calculated based on downhole data, such as data acquired through logging or other downhole measurement devices. Post-stimulation pressure measurements from a simulated stimulation in the formation may be determined after and/or during the simulation of the stimulation. The change in pressure between initial pressure measurements and post-stimulation pressure measurements may be used, for example, to predict if there may be a seismic event.

Pore pressure within a volume of interest in a formation may be determined, for example, by using overlay charts to empirically match well log data to drilling fluid weights, using physical characteristics of the borehole, such as measuring density, measuring electrical characteristics, e.g., resistivity or conductivity, or measuring chemical characteristics, e.g., salinity, elemental cationic concentration, sulfate or carbonate ions concentration, or changes in rate of escape of atomic particles, or by measuring acoustic emissions. In some embodiments, data for calculating pore pressure may be obtained using measurement-while-drilling (MWD) techniques or after drilling by using recorded data or openhole wireline data.

Increases in pore pressure resulting from injection of fracturing fluid may be modeled over the combination of natural and manmade fractures. According to methods of the present disclosure, initial pore pressures may be calculated prior to an injection of fracturing fluid or prior to a simulation of injecting fracturing fluid. A model of a fracture growth pattern in the formation, including interaction of hydraulic fractures, natural fractures and faults, after injection of fracturing fluid may then be constructed. Resulting pore pressures after simulation of the injection of fracturing fluid may be calculated based on the model. The change in pore pressure between initial pore pressures and resulting pore pressures may be used to predict whether a seismic event may occur.

According to some embodiments of the present disclosure, an increase in pressure from initial pressure within a formation model prior to stimulation to resulting pressure within the formation after a stimulation is simulated may be calculated based on the volume of fluid that is simulated as being injected into the formation. In such embodiments, the volume of stimulation fluid injected may be related to the increase in pressure, where the larger volume of stimulation fluid injected, the larger the increase in pressure, and vice versa. The volume of fluid that flows into the formation may be calculated based, in part, on the porosity of the formation, and the extent of the fluid flow (how far it goes into the formation away from the point of injection) may be calculated, in part, based on the permeability of the formation.

Prediction of whether a seismic event may occur based on a modeled increase in pressure within a formation may include comparing the modeled increase in pressure with previously conducted drilling operations having the same or similar increases in pressure. For example, if a previously conducted physical drilling operation experienced increases in pressure within 10 percent of the modeled increases in pressure, and did not result in any measured seismic events, it may be predicted that the modeled increases in pressure would not result in seismic events, and vice versa. Other factors that may be considered when predicting whether a seismic event may occur based on a modeled increase in pressure within a formation may include the type of formation or formation composition. For example, formation compositions that have been shown in physical drilling operations to have higher likelihoods of seismic activity may be an indication that a modeled formation having the same or similar composition may have a higher likelihood of a seismic event when exposed to increased pressures. In some embodiments, calculated material properties for a modeled formation composition may be used to predict effects of the increased pressure on the formation composition, including strain or movement in the formation, which may indicate a predicted seismic event in the formation.

According to some embodiments, prediction of whether a seismic event may occur based on a modeled pressure increase within a formation may be performed using a computer software program. For example, due to the complexity of the hydraulic fracture geometry and its interaction with the natural fractures, computer software programs using unstructured grids to explicitly model and simulate hydraulic fracture networks fluid flow may be used for increased accuracy and performance to predict effects from an increase in pressure within the modeled formation. Computer software programs that may be useful for such purposes may include but are not limited to INTERSECT™ or ECLIPSE™ software by Schlumberger, VIP™ or Nexus™ software by Halliburton, IME™ by CMG, or Tempest MORE™ by Emerson.

Further evaluation of rock failure from a simulated stimulation in a formation may be conducted using 3D static or 4D flow-, pressure-, and temperature-coupled calculations for rock stresses, deformations, and failure using simulation software, such as VISAGE by Schlumberger or Abaqus™ by SIMULIA/Baker Hughes.

According to embodiments of the present disclosure, further evaluation of rock failure from a simulated stimulation in a formation to determine generation of micro-seismic events may include generating a stress profile of the formation based on a modeled increase in pressure. As used herein, a stress profile may refer to a map of stress magnitudes over an area of the formation.

Coupling 3D reservoir geomechanics (e.g., a mechanical earth model) and hydraulic fracturing modeling may allow for a more accurate stress profile generation, reflecting the structure, heterogeneity/anisotropy, pressure, and temperature effects from well to reservoir scale. Coupling 3D reservoir geomechanics and hydraulic fracturing modeling may also enable tracking fracture complexity, including the effect of real 3D state of stress, and may define the right conditions prior to and during early stimulation and during medium/long term production.

According to one or more embodiments, a stress profile may be mapped on a combined fracture growth and mechanical earth model of a formation based on calculated pressure changes in the formation as a result of a stimulation. A stress field may then be defined on the stress profile, where the stress field may identify a selected stress criterion. For example, a stress field may be defined on a stress profile delineating a distance through the formation subjected to a minimum amount of stress increase from the stimulation. In one or more embodiments, a stress field may be defined on a stress profile delineating a distance through the formation subjected to a minimum amount of stress from the increase in pressure.

In some embodiments, calculated change in pore pressure may be used to predict if a seismic event will occur from the stimulation, while a calculated stress profile may be used to predict the magnitude of the seismic event. For example, a preselected value for a change in pore pressure in a formation from stimulation may be selected based on, for example, detected seismic events resulting from physically performed and/or simulated stimulations having similar designs and pore pressure change. If a change in calculated pore pressure from a simulated stimulation is greater than the preselected value, a seismic event may be predicted. The stress profile may then be calculated for the simulated stimulation, which may be used to predict the magnitude of the predicted seismic event, for example, by determining if a stress field extends through a geological feature and/or by further calculating strain or movement in the formation resulting from the increase in stress.

Based on the resulting stress profile, rock failure analysis may be performed on a formation model to analyze failure of rock in the formation resulting from the changes in stress and determine movement in the formation due to rock failure. Rock failure analysis may include identifying critically stressed regions within a stress profile (e.g., by defining a stress field on the stress profile as areas experiencing a minimum amount of stress), predicting fracture intensity, inspecting zones close to shear or tensile mobilization, and/or determining strain, slip and other deformation in the rock. In some embodiments, failure planes, such as from shear and/or tensile mobilization, may be generated in a mechanical earth model of a formation. Rock failure analysis and modeling of rock failure may be performed using rock failure analysis software. For example, rock failure analysis software, such as Mechanical Fracture Intensity Predictor by Schlumberger or RocPlane, may be used to identify critically stressed regions in formation from a hydraulic fracturing operation, generate failure planes in a mechanical earth model of the formation, and predict fracture intensity based on well log data accessible to the software.

Using a stress profile of a formation based on the increase in pressure from a stimulation, tensile and shear mobilization in the formation may be calculated. For instance, assuming that the formation obeys an isotropic elastic behavior, before pumped fluid penetrates the formation, the tensile strength of the rock $T_o$ can be derived from Kirsch's solution, which reads: $T_o=P_w+\sigma_H-3\ \sigma_h+P_p$, where $P_w$ is the wellbore pressure at fracture initiation, $P_p$ is the formation pressure (i.e. pore pressure) and $\sigma_H$ and $\sigma_h$ the maximum and minimum total horizontal stress, respectively. Similarly, when wellbore pressure $P_w$ changes, shear failure is triggered when: $P_w=P_p+(3\sigma_H-\sigma_h-2P_p-UCS)/(1+N)$, where UCS is the unconfined compression strength of the rock, $N=(1+\sin \Phi)/(1-\sin \Phi)$ is the friction coefficient and $\Phi$ is the rock internal friction angle.

Micro-seismic activity in a formation may be generated by geomechanical strain or slip or other deformation in the formation. Strain or movement in the formation may be calculated using the stress profile (the stress the formation is under from the stimulation, continuously mapped throughout the formation area being simulated) and estimated rock mechanical properties. The rock mechanical properties do not change from a stimulation, and thus, the rock mechanical properties estimated prior to simulation of the stimulation (e.g., collected to generate the mechanical earth model) may be used for calculating strain. By calculating deformation type and magnitude of rock in a formation, micro-seismic activity may be predicted, including the magnitude of the micro-seismic activity.

Further, micro-seismic activity in the formation from the calculated tensile and shear mobilization may be predicted and mapped onto a combined fracture growth and mechanical earth model.

According to embodiments of the present disclosure, micro-seismic events resulting from a failure of rock in a formation may be described by seismic moment tensors. For example, stresses and deformation induced in a formation by a stimulation of an injection of fluid into the formation may be used and applied in a similar way to micro-seismic data in order to derive a moment tensor enabling visualization of micro-seismic events. Seismic moment tensors include symbols (e.g., spherical or "beach ball" symbols) that may be used to represent the type of failure that occurred, such as shearing or tearing failures, opening or closing fractures (changes in volume) or a combination of failures. For example, seismic moment tensors may be decomposed into independent parameters, including three geometric parameters representing the orientation of the fracture and slip, a total seismic moment parameter representing the strength of the event, and parameters representing the relative strengths of double-couple (produced from slip on a planar fault surface), compensated linear vector dipole (produced from outward motion in a single plane due to normal shortening) and isotropic components (produced from explosive or implosive mechanism).

According to embodiments of the present disclosure, seismic moment tensors may provide a way to represent strain at a source of a micro-seismic event resulting from a determined stress profile in the formation, as discussed above.

Determination of micro-seismic activity in a formation resulting from stimulation (injection of a volume of fluid into the formation) may be used to predict seismic activity (on a macro scale) of the formation.

Surface or downhole micro-seismic information acquired from a physical stimulation operation may be used to calibrate a previously generated model of the stimulation operation. Calibrating the model may include matching the predicted micro-seismicity to the measured micro-seismicity from the physical stimulation.

For example, micro-seismic data from sensor arrays in a formation may be collected, complex sets of recorded acoustic waveforms may be analyzed, and the spatial and temporal evolution of fracture networks in 4D, relative to the location of the fracturing treatment, may be monitored and analyzed using visualization and interpretation techniques to provide measured micro-seismicity data from a physical stimulation. Measured micro-seismicity data may be updated in real time.

Upon predicting seismic events from a stimulation design in a formation, one or more parameters of the stimulation design may be altered to mitigate risk of the seismic event. For example, a recommendation for mitigating the risk of generating induced seismicity, may include but is not limited to, altering drilling direction, fracture initiation point locations, fracture fluid volume, fracturing fluid type, and maximum proppant concentration.

According to embodiments of the present disclosure, methods may be used for evaluating the potential of generating induced seismicity caused by fluid injection operations conducted in multiple stages. For example, according to some embodiments of the present disclosure, a method for evaluating the potential of generating induced seismicity may include obtaining a mechanical earth model of a formation and modeling a hydraulic fracture growth pattern in the formation from a stimulation of the formation, where the stimulation may be performed in a plurality of stages along a borehole extending through the formation. Performing a stimulation in multiple stages may include perforating and injecting a volume of fluid into sections of the borehole, where fluid is injected into a single section before injection of fluid into another section. Mechanical plugs or other isolating or diverting techniques may be used to seal off sections of a borehole (each section extending a distance along the borehole). For example, a first section of a wellbore may be perforated, and after a volume of fluid is injected into the perforated first section, the first section may be sealed off with a mechanical plug. After the first section is sealed, a second section may be perforated and stimulated with an injection of fluid. The second section may then be sealed with a second mechanical plug, and one or more subsequent sections may be perforated, stimulated and sealed. Once each stage (or section) is completed, the mechanical plugs may be removed to allow hydrocarbons or other retrievables to flow from the formation to the surface through the wellbore.

An increase in pressure in the formation resulting from the stimulation may be determined, for example, based on the volume of fluid being injected into the formation. A stress profile may be generated for each of the stages over which the stimulation is completed, where each stress profile includes a map of stress values over an area of the formation. For example, a stimulation design may include injecting a volume of fluid into the formation in multiple stages, where a first volume of fluid is injected into a first section along a wellbore, and subsequent volumes of fluid are injected into subsequent sections along the wellbore. Different or equal volumes of fluid may be injected into different sections along the wellbore.

After obtaining a mechanical earth model of a formation and modeling a hydraulic fracture growth pattern in the formation from a stimulation of the formation performed in multiple stages, at least one of the stages of the stimulation may be physically performed. According to embodiments of the present disclosure, at least one stage of a multistage stimulation may be physically performed after simulation of one stage in the multistage stimulation, after simulation of more than one stage but less than all stages of the stimulation, or after simulation of each stage in the multistage stimulation.

Stress within the area of the formation around a physically completed stage (perforated and injected with a volume of fluid) of the stimulation may be measured to generate a measured stress profile of the physically completed stage. The area of formation around a physically completed stage of the stimulation experiencing an increase in stress from the stimulation stage may vary, for example, depending on the volume of fractures generated from perforating and the volume of fluid injected.

Each stage of the simulation that is physically completed in the multistage stimulation may be calibrated prior to physically performing a subsequent stage of the stimulation. Calibrating may include updating one or more input parameters of the combined fracture growth and mechanical earth model to match the modeled stress profile of the physically completed stage with the measured stress profile of the physically completed stage.

Calibrating stages in a multistage stimulation as they are completed with a simulation of the multistage stimulation may allow for correction in the simulation model and provide greater accuracy in predicting micro-seismic events resulting from the multistage stimulation. For example, if a physically completed stage of a multistage stimulation results in higher than expected stress or micro-seismic activity than predicted, one or more subsequent stages of the multistage stimulation may be adjusted to reduce stress or micro-seismic activity from the subsequent stages.

In some embodiments, a rock failure analysis may be performed on the formation based on the stress profile for at least one stage in a multistage stimulation to predict micro-seismic activity. As discussed above, rock failure analysis may include analysis of rock failure (e.g., type of failure) and movement of rock in the formation resulting from the changes in stress from the stimulation. Rock failure analysis may include identifying critically stressed regions within a stress profile (e.g., by defining a stress field on the stress profile as areas experiencing a minimum amount of stress), predicting fracture intensity, inspecting zones close to shear or tensile mobilization, and/or determining strain, slip and other deformation in the rock. In some embodiments, failure planes, such as from shear and/or tensile mobilization, may be generated in a mechanical earth model of a formation. Rock failure analysis and modeling of rock failure may be performed using rock failure analysis software.

After conducting a rock failure analysis for a stage of a multistage stimulation, the stage may be physically completed, and the micro-seismic activity from the physically completed stage may be measured and compared with the predicted micro-seismic activity of the simulation of the stage. For example, a first stage in a multistage stimulation may be simulated in a combined fracture growth and mechanical earth model, and rock failure analysis may be conducted on the simulated first stage to predict micro-seismic activity resulting from the first stage stimulation. The first stage may then be physically completed in a section of a borehole, and micro-seismic activity from the physically completed first stage may be measured. The simulation of the multistage stimulation may be calibrated using the physically completed first stage by updating one or more input parameters of the multistage stimulation model to match the predicted micro-seismic activity of the first stage with the measured micro-seismic activity of the first stage. One or more subsequent simulated stages of the multistage stimulation may then be physically performed and used to further calibrate the multistage stimulation simulation.

In some embodiments of simulating a multistage stimulation, rates of stress propagation may be calculated for each simulated stage of the stimulation based on the increase in pressure from injecting a volume of fluid into each stage of the stimulation. For example, a first rate of stress propagation may be calculated in a first stage of a multistage stimulation based on the increase in pressure in the simulated first stage of the stimulation resulting from injection of a first volume of fluid into the section of the borehole defined by the first stage. The simulated increase in pressure in the simulated first stage may be predicted based on the first volume of fluid, where the increase in pressure is proportional to the first volume of fluid. Rates of stress propagation in subsequent stages of the multistage stimulation may be calculated and compared with the rate of stress propagation calculated in the other simulated stages. Depending on the rate of stress propagation calculated in one or more stages of a multistage stimulation, parameters of the stimulation may be altered, for example, the volume of fluid injected into one or more stages, the volume of fractures generated in one or more stages, and the size of one or more stages (the distance the defined section of the stage extends along the borehole).

A stress profile may be determined for one or more stages of a multistage stimulation and mapped on a combined fracture growth and mechanical earth model of the multistage stimulation. A stress field may then be defined on the stress profile for one or more of the simulated stages. The stress field may delineate a distance through the formation subjected to a minimum amount of stress from the increase in pressure. In some embodiments, the stress field may delineate a distance through the formation subjected to a minimum amount of change in stress resulting from an injection of fluid during one or more stages of the multistage stimulation. The extent of a stress field may depend on, for example, the reservoir pressure and mechanical properties of the rock.

Based on the extent of a stress field, a seismic event may be predicted. For example, if a stress field is calculated to extend a distance into the formation that hits one or more geological features, such as a fault in the formation, a seismic event may be predicted.

For example, FIG. 2 shows a diagram of a method for predicting whether a seismic event may occur in a multistage stimulation. As shown, a borehole 200 may extend through a formation 210 of interest. A multistage stimulation may be designed along a horizontally extending section of a borehole, as shown, or along a section of a borehole extending a different direction, e.g., extending at an angle from the surface of the formation. The multistage stimulation design may include multiple stages 220, 222 that are sectioned off, for example, using plugs 230, and selected perforation locations in each stage. A simulation of the multistage stimulation may include simulating perforating a first stage 220 at the selected perforation locations and injecting a first volume of fluid into the section of the borehole in the first stage 220, resulting in a fracture growth pattern 240. The simulation of the multistage stimulation may be modeled in a combined fracture growth and mechanical earth model, as described above. The pressure change in the formation resulting from the injection of the first volume of fluid may be modeled in the combined fracture growth and mechanical earth model. The first volume of fluid is the volume used for calculating the pressure increase in the formation from the first stage. From the calculated increase in pressure (as well as modeled fracture pattern and geomechanics of the formation), a stress profile may be modeled. One or more stress fields may then be defined on the stress profile.

As shown in FIG. 2, stress fields 250, 252, 254 may define different areas of the formation subjected to different ranges of increase in stress from the first stage of the stimulation. For example, stress field 250 may be drawn to delineate an area of the formation subjected to a first amount of increase in stress from the first stage stimulation. Stress field 252 may be drawn to delineate an area of the formation subjected to at least a second amount of stress increase, but less than the first amount of stress increase, from the first stage stimulation. Stress field 254 may be drawn to delineate an area of the formation subjected to at least a third amount of stress increase, but less than the second amount of stress increase, from the first stage stimulation.

If a stress field subjected to a selected minimum value of stress or stress increase extends into a geological feature, such as the fault 260 shown in FIG. 2, it may be predicted that a seismic event may occur in the formation, depending on, for example, the nature and size of the geological feature and the minimum value of stress or stress increase selected to define the stress field. If a seismic event is predicted, a recommendation for mitigating the risk of generating induced seismicity may be provided, including, for example, altering the drilling direction of the borehole, altering fracture initiation point locations (perforation locations), altering fracturing fluid volume (the amount of fluid being injected into one or more stages), altering fracturing fluid type, and/or altering the maximum proppant concentration in the fluid being injected. In some embodiments, when a seismic event is predicted from a first stage of a multistage, one or more parameters of a subsequent stage of the multistage stimulation may be altered, for example, altering the perforation locations of the subsequent stage and/or altering the volume of fluid injected into the subsequent stage. An altered stimulation design (e.g., one or more parameters altered as a response to a predicted seismic event in a first simulation of a stimulation) may be simulated according to methods disclosed herein in a subsequent simulation.

In some embodiments, a seismic event may be predicted when a stress field delineating an area of a formation subjected to a selected minimum value of stress or stress increase resulting from an injection of fluid extends into an active fault. An active fault may be determined by monitoring the formation of interest for a duration of time to determine if and which portions of the formation are moving relative to other portions of the formation. For example, a plurality of seismic measuring devices, such as seismometers, may be disposed at different locations along a formation of interest. The seismic measuring devices may measure motion of the ground, include micro-seismic events, over a period of time to determine if the formation of interest has an active fault.

A multistage stimulation may be calibrated in real time. For example, referring again to FIG. 2, the first stage 220 may be calibrated prior to physically conducting the second stage 222. In such embodiments, a simulation of the multistage stimulation may be generated, including a simulation of the first stage 220 and the second stage 222. One or more predictions resulting from the multistage stimulation may be made for the first and second stages 220, 222, including, for example, a prediction of an increase in pressure, a prediction of one or more stress fields, and/or a prediction of micro-seismic activity. After simulation of the multistage stimulation, the first stage 220 of the multistage stimulation may be physically completed. Measurements of one or more parameters (e.g., stress, pressure, micro-seismic activity) may be taken from the physically completed first stage 220 and compared to the predicted parameters of the simulated first stage 220 in order to determine accuracy of the simulation model. In some embodiments, when differences between predicted parameters and measured parameters are determined from the first stage, the first stage of the simulation may be calibrated by matching the predicted parameters to the measured parameters. After calibrating the first stage 220, the simulation of the multistage stimulation may be repeated to determine one or more predictions in the second stage 222. Based on changes in predictions from the calibrated simulation of the multistage stimulation, one or more stimulation parameters (e.g., perforation locations and/or volume of fluid injected) of the second stage 222 may be altered to mitigate risk of induced seismic activity.

In some embodiments, a first stage of a multistage stimulation may be modeled, and the propagation of pressure increase may be monitored over a period of time. The simulated first stage may be physically conducted over the period of time and calibrated in real time to match predicted parameters with the measured parameters. If predicted and/or measured parameters result in an induced seismic event, one or more stimulation parameters may be altered prior to physically conducting a subsequent stage of the multistage stimulation. For example, upon predicting an induced seismic event from simulation of a first stage in a multistage stimulation and prior to physically conducting the subsequent stage of the multistage stimulation, an amount of fluid being physically injected into the first stage of the stimulation may be flowed back to the surface of the formation to decrease pressure effects from the first stage stimulation.

As used throughout this disclosure, "first" may be used to refer to an initial occurrence (prior to all other occurrences of the same type) or may be used to refer to a previous occurrence (prior to one or more occurrences of the same type). For example, a first stage may be the first of all stages in a multistage stimulation or may refer to any stage prior to a subsequent stage.

Systems that may be used for evaluating the potential of generating induced seismicity according to embodiments of the present disclosure may include a computer processor and memory with instructions executing on the computer processor with functionality to model a stimulation of a formation, as described herein. For example, the memory may include instructions for receiving parameters of the formation. Parameters of the formation that may be received and processed may include, for example, wellbore data collected from logging or other data collecting operations, such as rock material properties, porosity, density, conductivity, and other formation data types described above. The instructions may further generate a mechanical earth model of the formation based on the received parameters of the formation. The instructions further have functionality to perform a simulation of a stimulation of the formation using generated the mechanical earth model to provide a combined fracture growth and mechanical earth model. The combined fracture growth and mechanical earth model includes a model of a hydraulic fracture growth pattern in the modeled formation resulting from the simulated stimulation of the formation. The combined fracture growth and mechanical earth model and/or predictions of resulting changes in pressure and/or stress in the formation from the stimulation may be presented on a graphical user interface.

Figure 3:
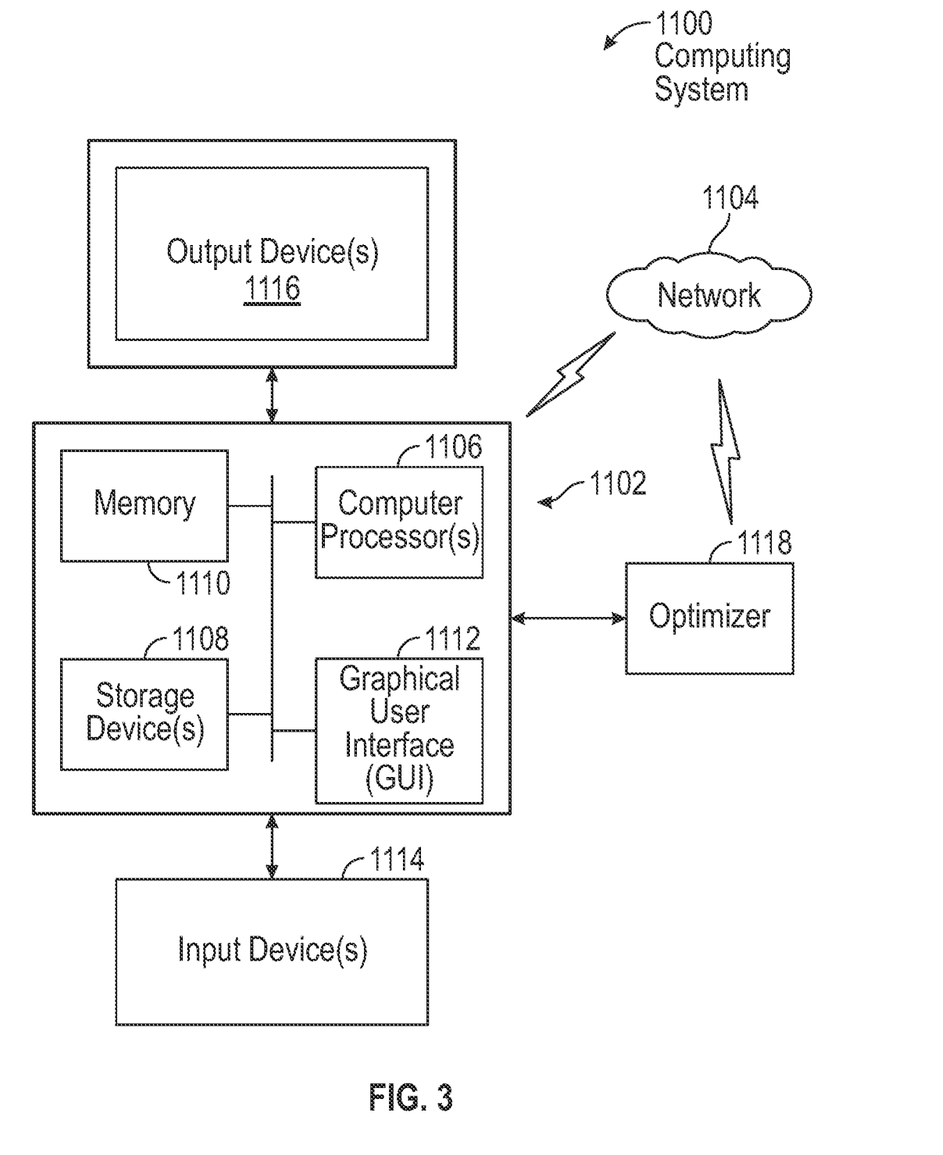
FIG. 3 depicts a system with which one or more embodiments of the present disclosure may be implemented.

FIG. 3 depicts a computing system with which one or more embodiments of the present disclosure may be implemented. In one or more embodiments, one or more of the modules and elements shown in FIG. 3 may be omitted, repeated, and/or substituted. Accordingly, embodiments of the present disclosure should not be considered limited to the specific arrangements of modules shown in FIG. 3.

As shown in FIG. 3, a computing system 1100 includes a computing device 1102 having one or more computing processors 1106, one or more storage devices 1108 (e.g., a hard disk, an optical drive such as a compact disk (CD) drive or digital versatile disk (DVD) drive, a flash memory stick, etc.), memory 1110 (e.g., random access memory (RAM), cache memory, flash memory, etc.), and a graphical user interface (GUI) 1112. The computing processor(s) 1106 may be an integrated circuit for processing instructions. For example, the computing processor(s) may be one or more cores, or micro-cores of a processor. The storage device(s) 1108 (and/or any information stored therein) may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The storage device(s) 1108 may be a device internal to the computing device 1102, or the storage device(s) 1108 may be an external storage device operatively connected to the computing device 1102. According to some embodiments, the storage device(s) 1108 may include a data repository having stored parameters from real/physical drilling systems and/or stored parameters from previously performed simulations, where at least one of the stored parameters may be submitted parameters for simulation of a drilling system. Additionally, the computing device 1102 may include numerous other elements and functionalities.

The computing device 1102 may be communicatively coupled to a network 1104 (e.g., a local area network (LAN), a wide area network (WAN) such as the Internet, mobile network, or any other type of network) through wires, cables, fibers, optical connectors, a wireless connection, or a network interface connection (not shown).

The computing system 1100 may also include one or more input device(s) 1114, such as a touchscreen, keyboard, mouse, microphone, touchpad, electronic pen, or any other type of input device. Further, the computing system 1100 may include one or more output device(s) 1116, such as a screen (e.g., a liquid crystal display (LCD), a plasma display, touchscreen, cathode ray tube (CRT) monitor, projector, 2D display, 3D display, or other display device), a printer, external storage, or any other output device. One or more of the output device(s) 1116 may be the same or different from the input device(s). The input and output device(s) may be locally or remotely (e.g., via the network 1104) connected to the computer processor(s) (1106), memory (1110), storage device(s) (1108), and GUI 1112. Many different types of computing systems exist, and the aforementioned input and output device(s) may take other forms.

Further, one or more elements of the computing system 1100 may be located at a remote location and connected to the other elements over a network 1104. Further, embodiments of the disclosure may be implemented on a distributed system having nodes, where each portion of the disclosure may be located on a different node within the distributed system. In one embodiment of the disclosure, the node corresponds to a distinct computing device. In another embodiment, the node may correspond to a computer processor with associated physical memory. In another embodiment, the node may correspond to a computer processor or micro-core of a computer processor with shared memory and/or resources.

The GUI 1112 may be operated by a user (e.g., an engineer, a designer, an operator, an employee, or any other party) using one or more input devices 1114 and the GUI 1112 may be visualized one or more output devices 1116 coupled to the computing device 1102. The GUI may include one or more buttons (e.g., radio buttons), data fields (e.g., input fields), banners, menus (e.g., user input menus), boxes (e.g., input or output text boxes), tables (e.g., data summary tables), sections (e.g., informational sections or sections capable of minimizing/maximizing), screens (e.g., welcome screen or home screen), and/or user selection menus (e.g., drop down menus). In addition, the GUI may include one or more separate interfaces and may be usable in a web browser or as a standalone application.

Although the output device(s) 1116 is shown as being communicatively coupled to the computing device 1102, the output device(s) 1116 may also be a component of the computing device 1102.

The computing device 1102 may execute instructions on the computing processor(s) 1106 to perform a simulation based on the formation and stimulation parameters selected or submitted by the user. Executing the simulation generates a set of predicted parameters (e.g., combined natural and hydraulic fracture pattern through the formation, pressure increase through the formation from the stimulation, stress profiles through the formation, and micro-seismic activity, as discussed above).

After simulation, one or more predicted parameters may be visualized by the GUI 1112 on the output device(s) 1116. In one embodiment, the visual outputs may include a combined fracture growth and mechanical earth model of the stimulated formation. Additionally, the outputs may be in the form of tabular data of one or more predicted parameters and/or graphs and may be represented as percentages or ratios.

Once presented with the predicted parameters, the user may modify one or more of the input parameters to reduce potential of generating induced seismicity from a stimulation. Modification may involve selecting a parameter from pre-existing values or inputting the parameter to obtain a modified value. For example, a different volume of fluid injected into the formation may be inputted in the simulation of a stimulation.

According to some embodiments, at least one of the parameters submitted into a computer processor for designing a stimulation of a formation may be modified based on one or more predicted parameters from a previous stimulation simulation performed by the computer processor, wherein modifying includes changing a value of at least one input parameter to obtain a modified input parameter. A second predicted parameter from a subsequent simulation may be presented on a graphical user interface, where the subsequent simulation is based on the modified input parameter. The predicted parameters from each simulation may be compared to determine optimized input parameters.

In one or more embodiments, an input parameter may be modified using an optimizer 1118. The optimizer 1118 may be connected to the computing device 1102, or may be integral with the computing device 1102. The optimizer 1118 may also be connected to the computing device 1102 or accessibly by the computing device 1102 using network 1104. The optimizer 1118 may modify one or more input parameters during a simulation. For example, a simulation of a multistage stimulation in a formation may be performed and the optimizer 1118 may modify one or more input parameters (e.g., input parameters for subsequent stages in the multistage stimulation) during simulation. After modification, and while the simulation is being performed, the simulation may continue based on the one or more input parameters modified by the optimizer 1118.

Further, a user may specify particular constraints with respect to one or more input parameters during simulation. When modifying, the optimizer 1118 may consider the constraints imposed by the user and may modify one or more input parameters based on the constraints. For example, a user may specify a range for the volume of fluid to be injected in the formation for stimulation. Once specified, a simulation may be performed and the optimizer 1118 may modify one or more input parameters such that the modification falls within the constraints specified by the user.

Further, the optimizer 1118 may modify one or more input parameters such that a particular performance is achieved during simulation. For example, a user may specify an area that a stress field may extend through the formation (the stress field defined as the area of the formation subjected to a minimum amount of stress or stress increase due to the stimulation). The user may specify the area, for example, to avoid extending into one or more known geological features that may induce seismicity if subjected to the increase in stress. Once specified, a simulation may be performed and the optimizer 1118 may modify one or more input parameters until the performance is achieved. In some embodiments, the drilling direction or orientation of a borehole through which the stimulation is to be conducted may be altered such that the area of a stress field does not extend into one or more geological features (e.g., active or non-active faults). In some embodiments, the location of stimulation along a borehole may be altered such that the area of a stress field does not extend into one or more geological features (e.g., active or non-active faults).

After modification, a second simulation may be executed by the computing device 1102. The second simulation may include the modified input parameter. The second simulation may be executed by the computing device 1102 using the processor(s) 1106 to generate a second set of predicted parameters. The second simulation may be performed using one or more of the methods set forth above. Once generated, the initial set of predicted parameters along with the second set of predicted parameters may be presented using GUI 1112 and output device(s) 1116. The sets of predicted parameters may be presented to the user for comparison and may be presented separately or combined. The sets of predicted parameters may be presented or visualized, for example, using models, plots, graphs, charts, and logs.

Additionally, a second simulation may occur simultaneously with the first simulation. For example, an engineer may select any number of input parameters of a stimulation of a formation to operate in particular operating conditions. The engineer may then run a number of simulations and compare resulting outputs (e.g., predicted parameters) to one another. Furthermore, the simulation and thus, the comparison, may be done in real-time. More specifically, the engineer may run a number of simulations for a given stimulation scenario and observe performance as the simulation progresses. Furthermore, the predicted parameters may be acquired and/or measured in the field. The results from one or more simulations may then be used to compare to one or more field acquired/measured parameters.

Figure 4:
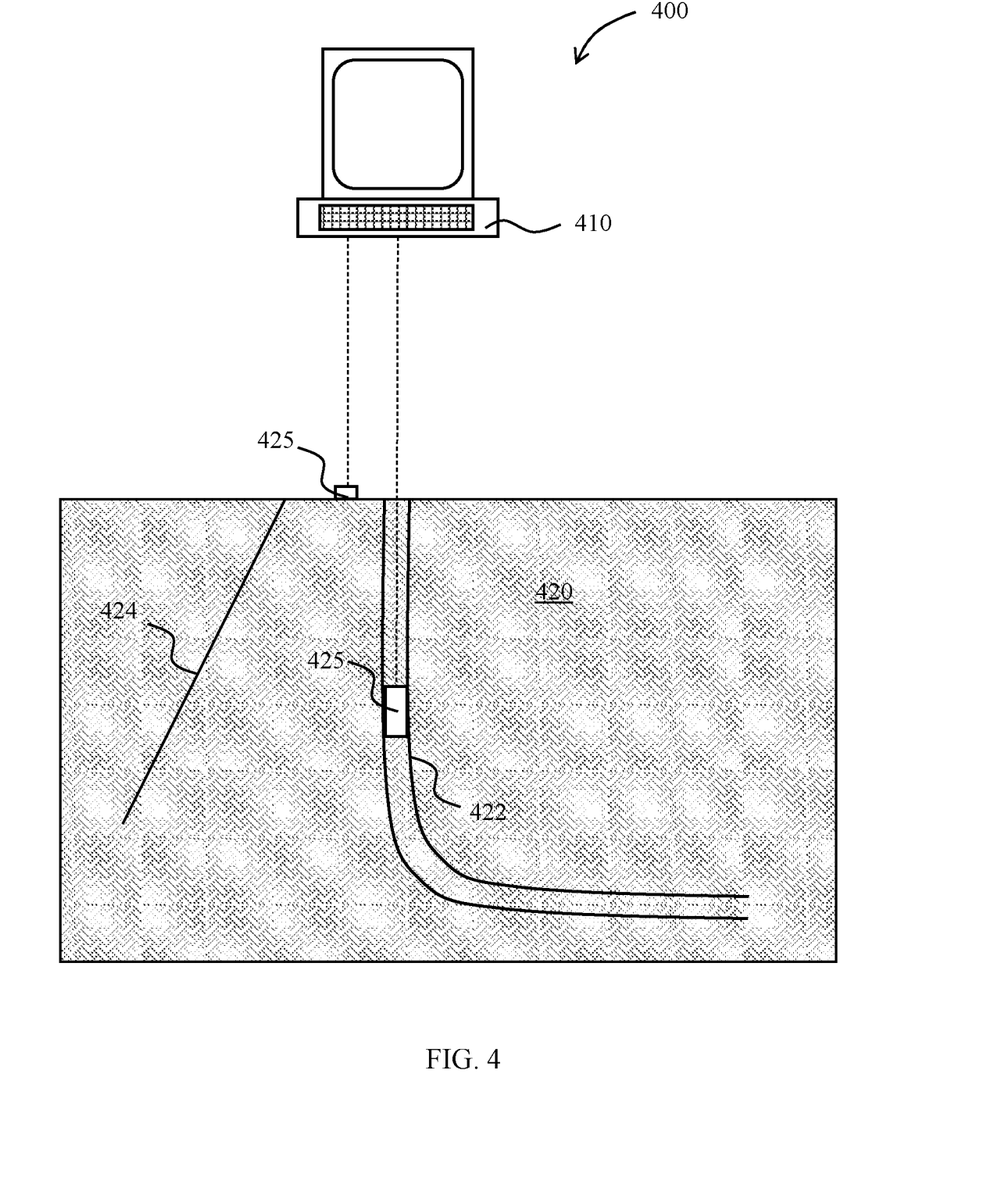
FIG. 4 shows a system according to embodiments of the present disclosure.

Referring now to FIG. 4, an example of a system 400 according to embodiments of the present disclosure is shown. The system 400 may include a computing system 410 having a computer processor and memory with instructions executing on the computer processor with functionality to receive parameters from a formation 420.

The memory may run on the computer processor instructions for modeling a mechanical earth model based on the received parameters of the formation, such as by using one or more computer programs for generating a mechanical earth model. The memory may also run on the computer processor instructions for simulating a stimulation of the formation, where the stimulation includes injecting a volume of fluid into the formation. The memory may include instructions, such a computer program described herein, with functionality to model a hydraulic fracture growth pattern from the stimulation of the formation in a combined fracture growth and mechanical earth model.

Upon simulating a stimulation of a formation and providing a combined fracture growth and mechanical earth model, a stress profile of the formation may be presented on a graphical user interface, where the stress profile shows changes in stress through the formation resulting from a change in pressure through the formation (from injection of the volume of fluid during the stimulation). The stress profile may be generated in the combined fracture growth and mechanical earth model from the mechanical earth model and the hydraulic fracture growth pattern model simulated by the computing system 410. In some embodiments, the computing system may further perform rock analysis from the combined fracture growth and mechanical earth model and the generated stress profile to predict rock failure, which may cause seismic activity. Based on the generated stress profile and/or based on the rock analysis, the potential of generating induced seismicity may be predicted.

In some embodiments, a system may include one or more sensors or measuring devices measuring at least one of the parameters of the formation, where the sensors or measuring devices may be in wireless or wired communication with the computer processor. For example, as shown in FIG. 4, measurement devices 425 may be used to measure material properties of the formation, such as through logging operations down a borehole 422 extending through the formation 420. For example, a sonic logging tool may be sent down a borehole 422 (e.g., a current well being drilled, an offset well, or an exploration borehole) to measure orientation of natural fractures, porosity, density, and other formation properties. In some embodiments, measurement devices 425 may be used on the surface of the formation 420 to measure one or more parameters of the formation. For example, seismometers may be disposed at one or more locations on the surface of the formation to monitor micro-seismic activity in the formation, which may be used to determine if there are any active faults 424 within the formation.

Although only a few example embodiments have been described in detail above, those skilled in the art will readily appreciate that many modifications are possible in the example embodiments without materially departing from this disclosure. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method, comprising:
    measuring, for a time period, micro-seismic events from a formation to determine if the formation has an active or non-active fault;
    obtaining a mechanical earth model of a formation;
    modeling, using the mechanical earth model, a hydraulic fracture growth pattern in the formation from a stimulation of the formation thereby generating a combined fracture growth and mechanical earth model, wherein the stimulation comprising an injection of a volume of fluid into the formation;
    determining a first increase in pressure in the formation resulting from the stimulation based on the combined fracture growth and mechanical earth model;
    receiving data indicating a second increase in pressure in the formation associated with a previously conducted drilling operation;
    comparing the first and second increases in pressures to determine if the first and second increases in pressure are within a pressure threshold relative to one another;
    predicting whether a seismic event will occur in the formation when the first and second increases in pressure are within the pressure threshold, wherein predicting comprises:
        predicting that the seismic event will occur in the formation when the second increase in pressure resulted in a previous seismic event;
        predicting that the seismic event will not occur when the second increase in pressure did not result in a previous seismic event; and
    altering at least one parameter of the stimulation to mitigate risk of the seismic event if the seismic event is predicted.

2. The method of claim 1, further comprising generating a stress profile of the formation based on the first increase in pressure, the stress profile comprising a map of stress magnitudes over an area of the formation.

3. The method of claim 2, wherein a stress field is defined on the stress profile, the stress field delineating a distance through the formation subjected to a minimum amount of stress from the increase in pressure.

4. The method of claim 2, further comprising calculating tensile and shear mobilization in the formation based on the stress profile.

5. The method of claim 4, further comprising modeling micro-seismic activity in the formation from the calculated tensile and shear mobilization.

6. The method of claim 1, further comprising, prior to obtaining the mechanical earth model, characterizing a plurality of properties of the formation, wherein characterizing comprises obtaining wellsite data from at least one of core data, borehole imaging data, outcrop analogues, and seismic data.

7. The method of claim 1, wherein the first increase in pressure is calculated based on the volume of fluid injected into the formation.

8. The method of claim 1, further comprising calibrating the mechanical earth model to match measured micro-seismicity from the stimulation.

9. The method of claim 1, further comprising physically performing the stimulation.

10. A method, comprising:
    obtaining a mechanical earth model of a formation;
    modeling, using the mechanical earth model, a hydraulic fracture growth pattern in the formation from a stimulation of the formation thereby generating a combined fracture growth and mechanical earth model, wherein, the stimulation is performed in a plurality of stages along a borehole extending through the formation;
    determining an increase in pressure in the formation resulting from the stimulation based on the combined fracture growth and mechanical earth model;
    comparing the increase in pressure in the formation and an additional increase in pressure in the formation resulting from a previous stimulation in the formation;
    generating a stress profile for each of the plurality of stages based on the comparison of the increase in pressure in the formation, the additional increase in pressure in the formation, and an increase in pressure for a previous stage of the plurality of stages, each stress profile comprising a map of stress over an area of the formation;
    physically performing at least one of the stages of the stimulation;
    physically measuring stress within the area of the formation around a physically completed stage of the stimulation to generate a measured stress profile of the physically completed stage; and
    calibrating the completed stage of the stimulation prior to physically performing a subsequent stage of the stimulation, the calibrating comprising updating one or more input parameters of the model to match the modeled stress profile of the completed stage with the measured stress profile of the completed stage, wherein updating the one or more input parameters mitigates risk of induced seismic activity in the subsequent state of the simulation.

11. The method of claim 10, further comprising calculating a first rate of stress propagation in a first stage of the stimulation based on the increase in pressure.

12. The method of claim 10, further comprising performing a first rock failure analysis on the formation based on the stress profile for at least one of the plurality of stages of the stimulation to predict micro-seismic activity.

13. The method of claim 12, further comprising measuring micro-seismic activity from the completed stage, and wherein the calibrating further comprises updating the one or more input parameters of the model to match the predicted micro-seismic activity with the measured micro-seismic activity.

14. The method of claim 10, further comprising defining a stress field on the stress profile, the stress field delineating a distance through the formation subjected to a minimum amount of stress from the increase in pressure.

15. The method of claim 14, further comprising predicting whether a seismic event will occur in the formation based on whether the stress field extends into a geological feature.

16. The method of claim 10, wherein updating comprises providing a recommendation for mitigating the risk of generating induced seismicity, the recommendation comprising altering at least one of a drilling direction, fracture initiation point locations, fracturing fluid volume, fracturing fluid type, and maximum proppant concentration.

17. The method of claim 1, wherein altering comprises altering in real time.

18. The method of claim 10, wherein calibrating comprises calibrating in real time.

\* \* \* \* \*